(12) United States Patent
Matsuoka

(10) Patent No.: US 6,755,934 B2
(45) Date of Patent: Jun. 29, 2004

(54) PROCESSING APPARATUS HAVING PARTICLE COUNTER AND CLEANING DEVICE, CLEANING METHOD, CLEANLINESS DIAGNOSIS METHOD AND SEMICONDUCTOR FABRICATING APPARATUS USING THE SAME

(75) Inventor: Kenji Matsuoka, Kumamoto (JP)

(73) Assignee: NEC Electronics Corporation, Kawasaki (JP)

( * ) Notice: Subject to any disclaimer, the term of this patent is extended or adjusted under 35 U.S.C. 154(b) by 72 days.

(21) Appl. No.: 09/950,748

(22) Filed: Sep. 12, 2001

(65) Prior Publication Data

US 2002/0029791 A1 Mar. 14, 2002

(30) Foreign Application Priority Data

Sep. 14, 2000 (JP) ........................................ 2000-280331

(51) Int. Cl.⁷ ............................................... H05H 1/00
(52) U.S. Cl. ............................ 156/345.33; 156/345.24; 156/345.29; 134/18

(58) Field of Search .................. 156/345.24, 345.25, 156/345.26, 345.33, 345.29; 134/18, 22.1, 21

(56) References Cited

FOREIGN PATENT DOCUMENTS

| JP | 06-013325 | 1/1994 |
|----|-----------|--------|
| JP | 07-086241 | 3/1995 |
| JP | 10-125609 | 5/1998 |
| JP | 10-289880 | 10/1998 |
| JP | 11-087248 | 3/1999 |

*Primary Examiner*—Parviz Hassanzadeh
(74) *Attorney, Agent, or Firm*—Katten Muchin Zavis Rosenman

(57) ABSTRACT

A dry gas jetting nozzle 5 and a discharge duct 7 for discharging dry gas in a chamber 9 are provided in a lid member 1 for closing an opening of the chamber. Dry gas is jetted into the chamber 9, inner pressure of which is reduced, to blow up particles staying in the chamber and the blown up particles are discharged through the discharge duct 7 while counting the blown up particles.

8 Claims, 8 Drawing Sheets

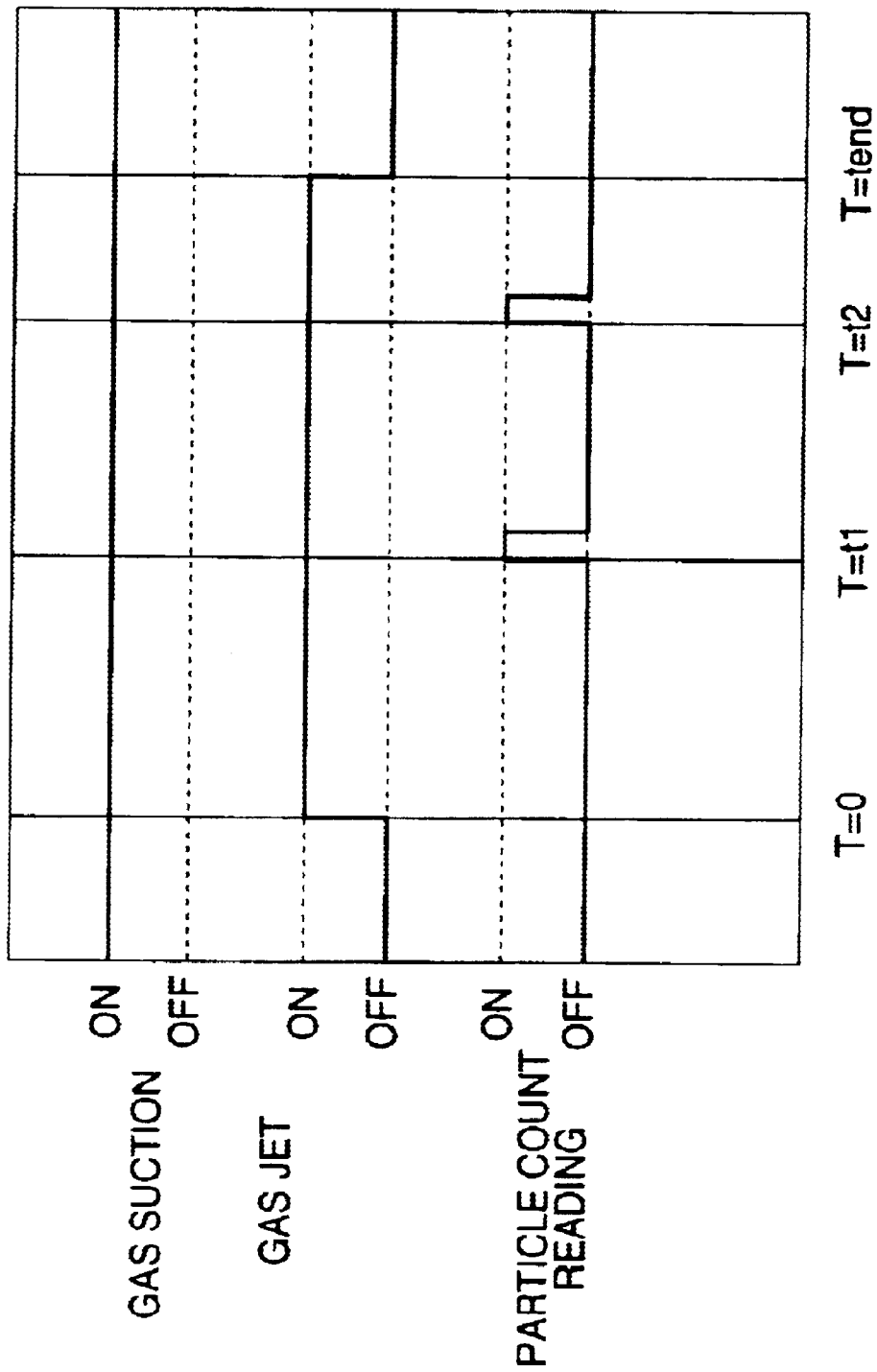

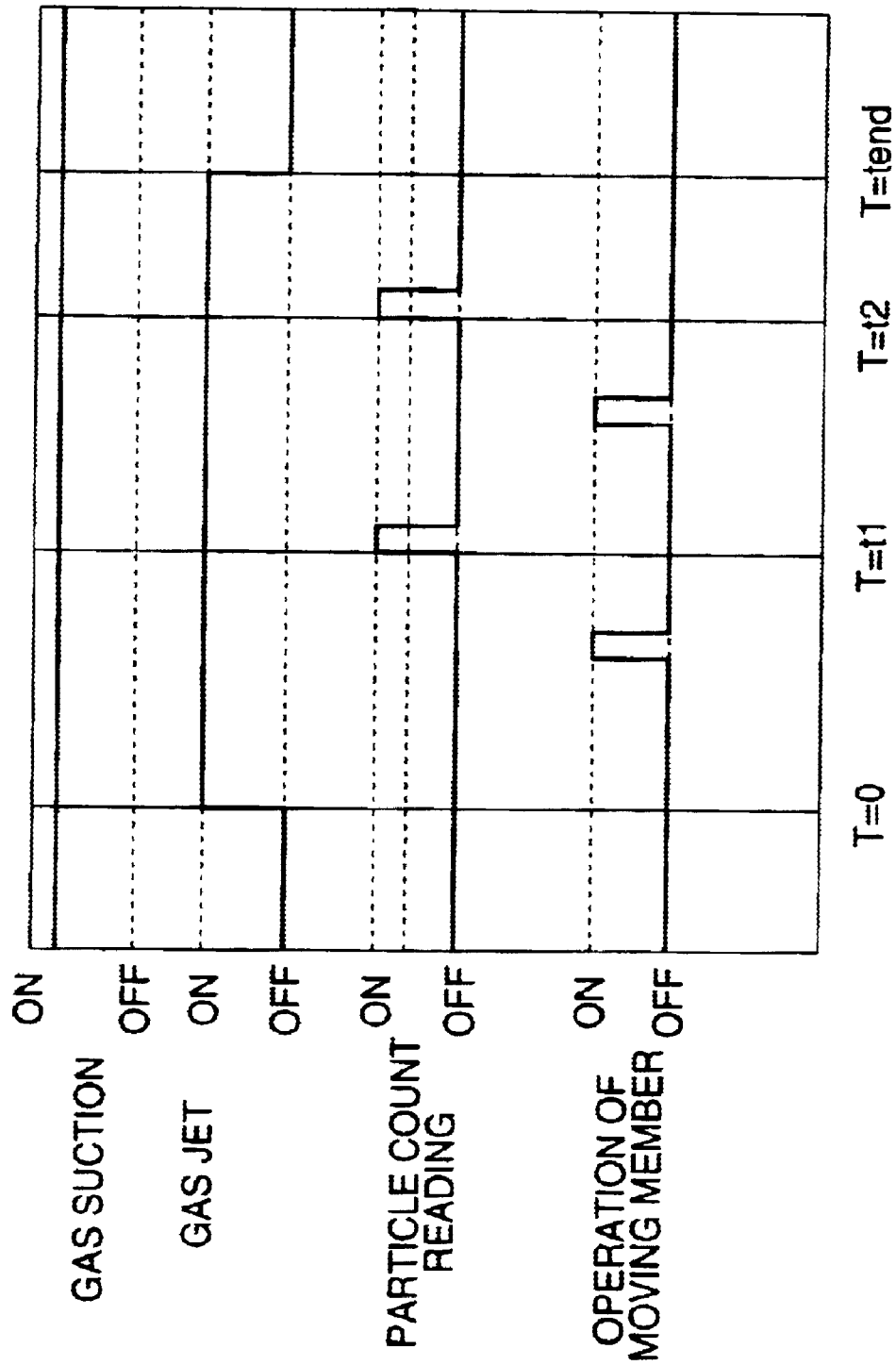

PROCESSING APPARATUS HAVING PARTICLE COUNTER AND CLEANING DEVICE, CLEANING METHOD, CLEANLINESS DIAGNOSIS METHOD AND SEMICONDUCTOR FABRICATING APPARATUS USING THE SAME

BACKGROUND OF THE INVENTION

1. Field of the Invention

The present invention relates to a vacuum processing apparatus equipped with a particle counter and a cleaning device using the same, and more particularly, to a portable cleaning device for a vacuum processing apparatus such as a dry etching apparatus or a chemical vapor deposition (CVD) apparatus for fabricating semiconductor devices and a cleaning method therefor. Moreover, the present invention relates to a cleanliness diagnosis method using the above-mentioned portable cleaning device and also relates to a semiconductor fabricating apparatus capable of removing particles within a chamber of a processing apparatus for etching a semiconductor substrate surface of such as a semiconductor substrate or for forming films on the semiconductor substrate surface.

2. Description of the Prior Art

In a dry etching apparatus for etching a semiconductor substrate or a CVD apparatus for forming thin films on a semiconductor substrate, particles of reaction products accumulate within a vacuum chamber of the dry etching apparatus or the CVD apparatus when they are operated for a long period of time. Such particles staying in the vacuum chamber are blown up by a sharp increase of pressure when the vacuum chamber is opened to atmospheric pressure after the etching process or the film forming process is completed. Therefore, a problem that particles blown up may be adhered to the processed semiconductor substrate, resulting in a processing error.

As a countermeasure therefor, it has been usual in order to restrict the increase of inner pressure of the vacuum chamber to introduce air into the vacuum chamber gradually to thereby prevent accumulated particles from being blown up. However, this method is not reliable, since it is necessary to periodically pull out a wafer stage from the vacuum chamber and manually remove particles in the vacuum chamber. It is troublesome to clean a sequestered, large inner area of the vacuum chamber through a narrow carry in/out port thereof, resulting in a problem that it takes a long time to clean the vacuum chamber.

A vacuum processing method and apparatus for solving this problem is disclosed in JP H7-86241A. In a chamber cleaning means in the vacuum processor disclosed therein, a cleaning gas inlet and an exhaust gas duct are provided in a chamber, which is a vacuum processing chamber, and a movable electric dust catcher is provided within the chamber. In this vacuum processor, dry gas at atmospheric pressure is introduced into the chamber through the cleaning gas inlet to blow up foreign materials or aliens in the chamber so that the aliens are carried out externally of the chamber by the gas flow through the exhaust gas duct. Further, residual aliens are caught by the electric dust catcher arranged within the chamber.

Moreover, according to the disclosed technique, plasma is generated in the chamber to separate reaction products accumulated on an inner wall of the chamber from the latter during the cleaning operation using dry gas and floating reaction products is removed by performing the introduction and exhaustion of dry gas.

The above-mentioned prior art is disadvantageous in that the chamber cleaning means has to be provided every vacuum processor to be cleaned, so that the cost of the vacuum processor becomes high. Further, the chamber cleaning means has no means for confirming whether or not there is any residual particle, which are blown up and are to be removed, in the chamber. There is a possibility of existence of residual particles in the chamber unless such confirming means is used. That is, when inner pressure of the chamber is increased to atmospheric pressure after the required processing is performed, there is a possibility that the residual particles are blown up and contaminate the processed semiconductor substrate.

It has been known that the reaction products accumulated on the inner wall of the chamber are not naturally peeled off from the inner wall unless a long period of time lapses. This means that the separation of reaction products adhered to the inner wall of the chamber by means of cleaning plasma to be performed simultaneously with the removal of particles staying in the chamber for a relatively short time is useless step.

Furthermore, if the chamber is made of transparent quartz, it is easy to confirm the degree of accumulation of the reaction products on the inner wall thereof. However, when the chamber is made of a translucent material such as aluminum, it is difficult to confirm the accumulation degree of reaction products.

Moreover, the separation of reaction products adhered to the inner wall of the chamber by irradiating them with plasma is possible if the thickness of reaction products on the inner wall is less than a certain value. However, in order to completely separate reaction products from the inner wall, it takes long time and, therefore, the disclosed method for separating reaction products adhered onto the inner wall of the chamber from the inner wall is not always advantageous.

SUMMARY OF THE INVENTION

An object of the present invention is to provide a portable cleaning device, which can be generally used in various semiconductor processors to preliminarily clean an inside of a chamber of the semiconductor processor to such extent that particles in the chamber are not blown up at a time when the chamber is opened to atmospheric pressure, and a cleaning method using the same cleaning device.

The cleaning device according to the present invention includes a dry gas-jetting nozzle provided in a lid member for closing an opening of the chamber of the semiconductor processor. The nozzle is arranged such that dry gas is jetted along an outer periphery of a wafer stage within the chamber. Further, a gas discharge duct, a particle counter for monitoring the number of particles in the chamber, a pressure gauge for measuring pressure within the chamber and a pressure regulation valve for regulating pressure within the chamber are provided in the lid member.

The cleaning device preferably includes a plate member suspended from the lid member to partitioning the nozzle from an outlet of the gas discharge duct. Further, the cleaning device is preferably provided with a damper for regulating the amount of exhaust gas flowing through the discharge duct. Preferably, the cleaning device includes an angle regulating mechanism for changing an angle of the nozzle. Further, dry gas is preferably nitrogen gas and the lid member is preferably made of a transparent resin material.

A cleaning method according to the present invention is to be performing by the above-mentioned cleaning device. The cleaning method comprises the steps of reducing inner pressure of the chamber after the latter is shielded by closing the opening of the chamber by the lid member, blowing up particles residing in the chamber by jetting dry gas into the chamber and discharging the particles by discharging dry gas through the gas discharge duct while counting the number of the particles by the particle counter.

The present invention is not limited to the above-stated cleaning device and cleaning method but they can be widely applied to cleanliness diagnosis or other fabricating apparatus such as semiconductor fabricating apparatus using a vacuum chamber.

For example, a processing device having a particle counter is also belongs to the present invention, in which a vacuum has an opening portion. And a dry-gas jetting nozzle is provided in the chamber for jetting dry gas into the chamber. Further, a discharge duct is provided in the chamber for discharging the dry gas in the chamber. Needless to say, a particle counter is also provided in the chamber for monitoring the number of particles within the chamber.

In such a processing device having a particle counter, a wafer stage may be housed in the chamber. A lid member for closing the opening portion of the chamber can be used in such a manner that the nozzle and the discharge duct are provided in the lid member.

For the processing device mentioned above, a pressure gauge can be provided in the lid member for measuring inner pressure of the chamber. Further, a pressure regulator valve can be provided in the lid member for regulating inner pressure of the chamber and the nozzle is arranged such that the dry gas flows along an outer periphery of the wafer stage within the chamber.

This processing device can be used as a cleaning device, wherein the lid member has a structure capable of attaching a plurality of the chamber such that the chamber is cleaned by using the dry gas.

This processing device can be also used as a cleanliness diagnosis method, wherein the lid member is attached to the opening portion after cleaning an inside of the chamber, and the dry gas is jetted into the chamber while reducing inner pressure of the chamber through the discharge duct and counting the particles by the particle counter.

The above-mentioned processing device can be used as a cleaning device by further comprising a supporting stand within the chamber for fixing a part to be diagnosed of its cleanliness. In such a cleaning device the nozzle may be arranged so as to be movable while jetting the dry gas in a scanning mode.

When the processing device mentioned above is used as a semiconductor fabricating apparatus, the chamber may be provided with a nozzle for jetting a material gas for forming a film on a semiconductor substrate, and an exhaust duct is provided into the chamber for exhausting a reactive gas for the film.

In such a semiconductor fabricating apparatus, it may further comprises a movable member, and wherein the chamber is provided with a lid member to close the opening, and the lid member is provided with the nozzle, the discharge duct and the particle counter, whereby the movable member moves at a time of at least one of process for transporting the semiconductor substrate and forming the film in accordance with a program installed therein.

BRIEF DESCRIPTION OF THE DRAWINGS

FIG. 9 is a timing chart for explaining a second cleaning method or cleanliness diagnosis method; and FIG. 10 is a timing chart for explaining a third cleaning method or cleanliness diagnosis method.

DETAILED DESCRIPTION OF THE PREFERRED EMBODIMENTS

Figure 1:
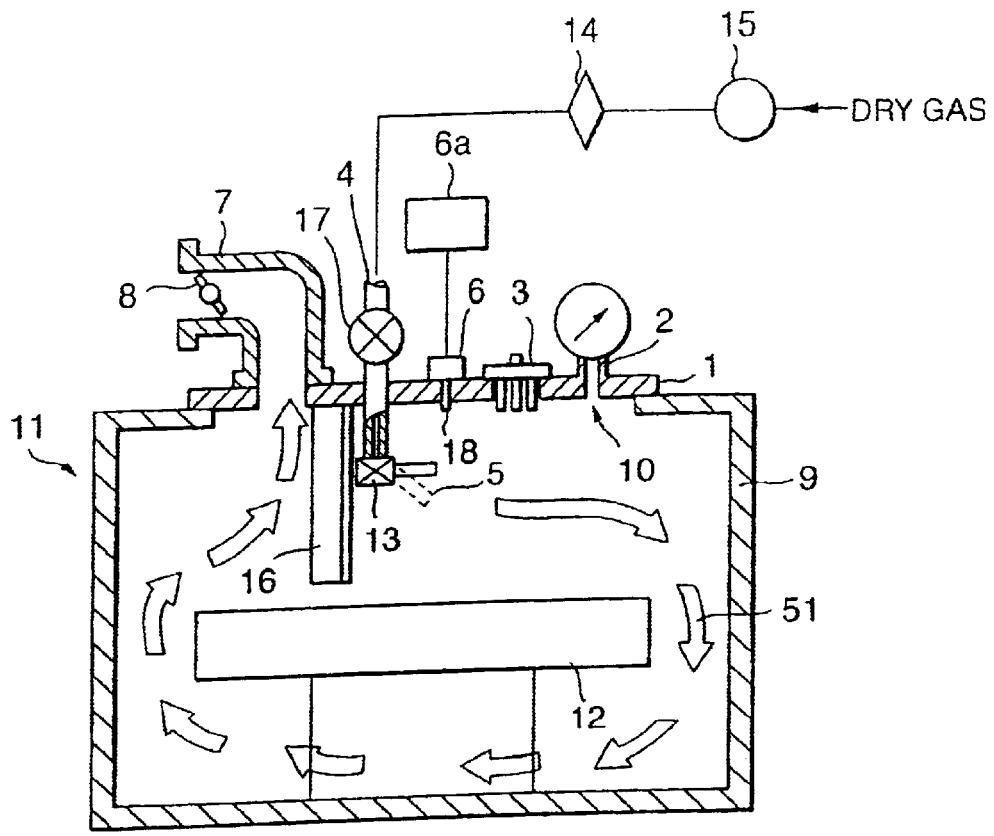
FIG. 1 is a schematic cross section of a cleaning device according to a first embodiment of the present invention, which is mounted on a semiconductor processor.

A cleaning device according to the first embodiment of the present invention is shown in FIG. 1 with a mechanism, which is housed in a chamber 9 of a semiconductor processor 11 and opposing to a wafer stage 12 in the chamber 9, that is, for example, an upper electrode and an upper electrode having a gas inlet portion, being removed for simplicity of illustration. A nozzle 5 for jetting dry gas along an outer periphery of the wafer stage 12 in the chamber 9 is mounted on a lid member 1 closing an opening 10 of the chamber 9. Further, a gas discharge duct 7 for discharging dry gas in the chamber 9, a particle counter 6 for counting particles in the chamber 9, a pressure gauge 2 for measuring inner pressure of the chamber 9 and a pressure regulator valve 3 for regulating inner pressure of the chamber 9 are mounted on the lid member 1.

The nozzle 5 connected to a gas supply tube 4 through a ball-and-socket joint is constructed such that a dry gas jetting direction thereof can be changed from horizontal to vertical by an angle regulation mechanism 13 composed of a worm gear and a worm wheel on a rotary shaft (not shown) on the lid member 1. In order to prevent dry gas jetted from the nozzle 5 from directly flowing into the gas discharge duct 7, a shielding plate 16, which extends downward from the lid member 1, is preferably provided between the nozzle 5 and the discharge duct 7.

Figure 2:
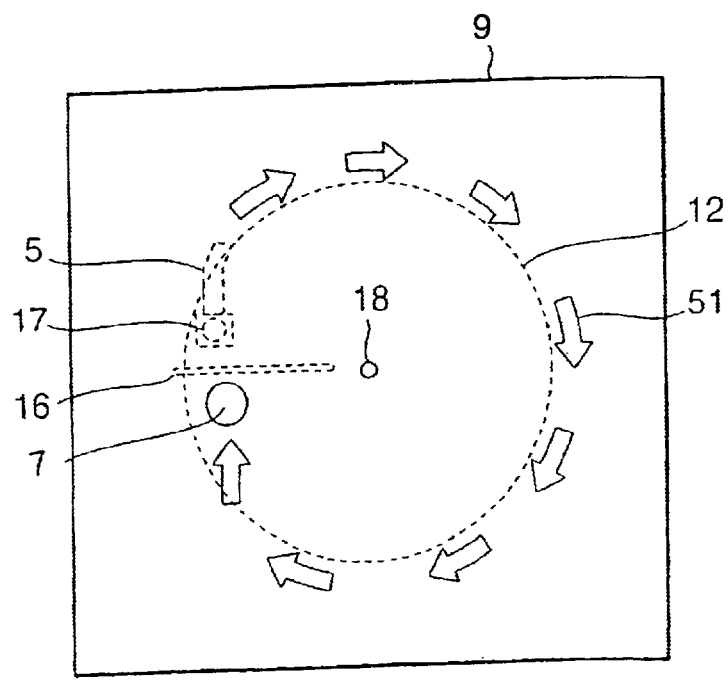
FIG. 2 is a plan view of a lid member shown in FIG. 1.

Length of the shielding plate 16 is selected such that a lower end of the shielding plate 16 is close to an upper surface of the wafer stage 12 without contact therewith. The angle of the nozzle 5 is set toward the outer periphery of the wafer stage 12. With such setting of the nozzle 5, dry gas flows in a direction shown by an arrow 51, so that it can blow up particles staying below the wafer stage 12. In order to enhance this effect, it is preferable that a top end portion of the nozzle 5 is bent to a tangential direction of the outer periphery of the wafer stage 12 as shown in FIG. 2.

The gas discharge duct 7 is arranged on an opposite side of the shielding plate 16 to the side of the nozzle 5 such that dry gas jetted from the nozzle 5 is not directly sucked therein. An outlet of the discharge duct 7 can be connected to an existing factory gas exhaust duct through a flexible hose. Incidentally, the discharge duct 7 is preferably provided with a damper 8 for regulating suction force of dry gas.

The particle counter 6, which is a light scattering type particle counter, has a suction port 18, which is inserted into the chamber 9 through a center portion of the lid member 1 such that it is positioned in a center portion of the chamber 9. A light receiving mechanism of the particle counter 6 including a irradiating mechanism for irradiating sucked particles with light and a photo-multiplier tube for detecting light scattered by particles is arranged on the chamber 9 and a display portion 6a of the particle counter 6, which includes an amplifier for amplifying a signal from the photo-multiplier and a wave height analyzer, is arranged in a suitable position. The particle counter may be any commercially available particle counter.

On the other hand, a piping system for introducing dry gas into the chamber is constructed with a regulator 15 for regulating pressure gas from a dry gas tube, a filter 14 for capturing minute dusts and an open-and-close valve 17 for cutting a dry gas supply to the nozzle 5. The pressure regulator valve 3 is a kind of variable leak valve for regulating pressure in the chamber 9 by sucking dry gas from the discharge duct 7. Inner pressure of the chamber 9 at that time can be read by the pressure gauge 2.

Preferably, the lid member 1 is made of a light-weight, transparent material such as acrylic resin so that an operator can carry it an interior of the chamber 9 can be monitored therethrough. Further, the exhaust duct 7 is preferably made of a lightweight resin material such as vinyl chloride resin.

The cleaning method according to the present invention, which is performed by using the cleaning device shown in FIG. 1, will be described with reference to FIG. 3 together with FIG. 1 and FIG. 2.

First, an upper mechanism of the semiconductor processor having the chamber to be cleaned is removed. Next, the lid member 1 is put on an opening portion 10 of the chamber 9 such that the lid member 1 closes the opening portion 10 when the upper mechanism of the semiconductor processor is removed. Thereafter, the chamber 9 is evacuated through the discharge duct 7. In this state is a gas suction state shown in FIG. 3. Inner pressure of the chamber 9 shown in FIG. 1 is lowered in this gas suction state.

Next, when inner pressure of the chamber 9 becomes a constant pressure preliminarily set by the pressure regulator valve 3, the open-and close valve 17 shown in FIG. 1 is opened to jet dry gas from the nozzle 5 into the chamber 9. Dry gas flows along the wafer stage 12 as shown by the arrow 51 to blow up particles existing below the wafer stage 12. Inner pressure of the chamber 9 is increased up to atmospheric pressure. When inner pressure of the chamber 9 becomes atmospheric pressure, the particle counter 6 counts particles blown up.

When the count of the particle counter is equal to or larger than a predetermined value, the open-and-close valve 17 is closed to stop the jetting of dry gas. Thereafter, dry gas in the chamber is discharged through the discharge duct 7. Then, when inner pressure of the chamber 9 reaches at, for example, 0.7 atm and becomes stable, the open-and-close valve 17 is opened to inject dry gas into the chamber 9 through the nozzle 5 again and residual particles are counted by the particle counter 6. This sequential procedures are repeated until the count number of particles becomes zero or smaller than a predetermined value, completing the cleaning of the chamber 9.

Incidentally, the minimum value of a measuring range of the particle counter is preferably set to, for example, 0.3 microns. This is because the smaller the size of particle is the easier to be blown up and the more difficult to be removed. Further, dry gas is preferably an inert gas, which is stable for reaction products. Particularly, inexpensive nitrogen gas is suitable therefor. Needless to say, the cleaning cycle can be performed automatically by a sequence control.

Figure 3:
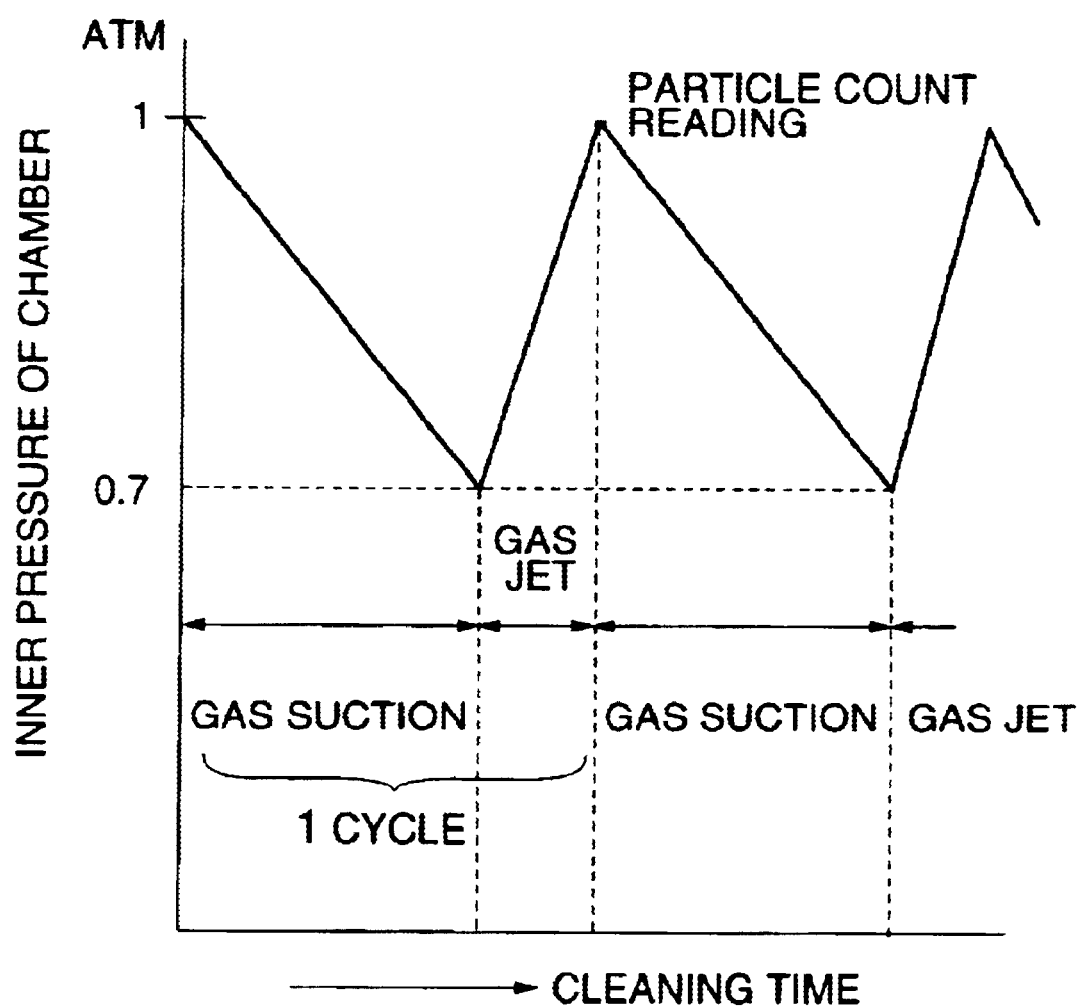
FIG. 3 is a time chart for explaining a cleaning operation with using the cleaning device shown in FIG. 1.

In FIG. 3, the case where the processor by the present invention is applied to the method of cleaning the chamber is indicated. However, the present invention is not limited to a mere cleaning method, and can be applied also for the diagnosis of the index of cleanliness of steel.

Figure 8:
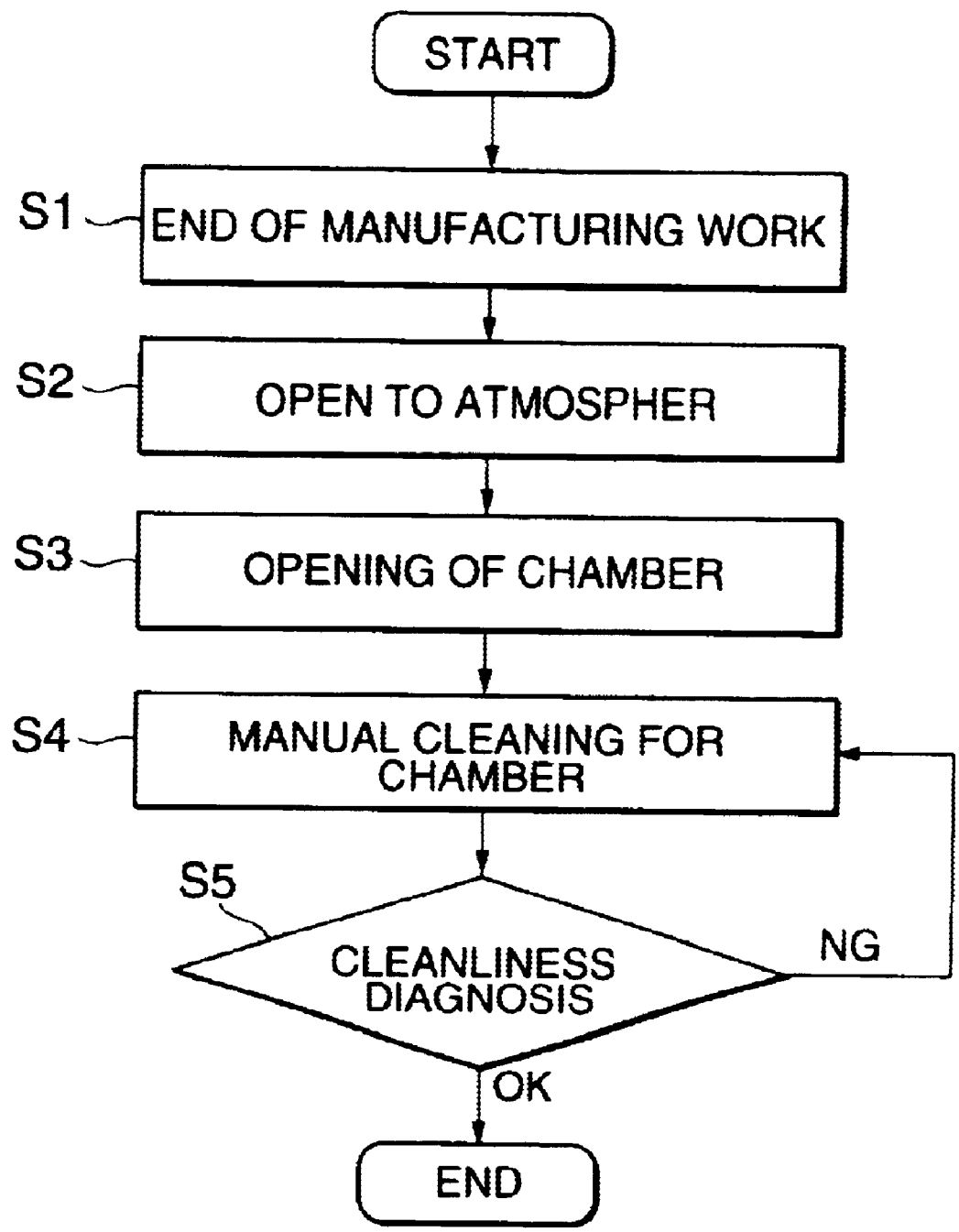
FIG. 8 is a flow chart showing a case of using the present cleaning device as a cleanliness diagnosis device.

For instance, the chamber can be cleaned manually by using human hands as shown by the flow chart shown in FIG. 8. In FIG. 8, after the first step (S1), where the manufacturing work of the semiconductor product by semiconductor-fabrication apparatus is ended, the chamber is subjected to the atmospheric pressure (the second step S2). Thereafter, the chamber is opened (the third step S3), and then the inside of the chamber is cleaned by human power (the fourth step S4).

There is an advantage by which the cleaning time can be shortened if the present invention is executed to diagnose the cleanliness of the chamber after the manual cleaning is carried out.

Figure 4:
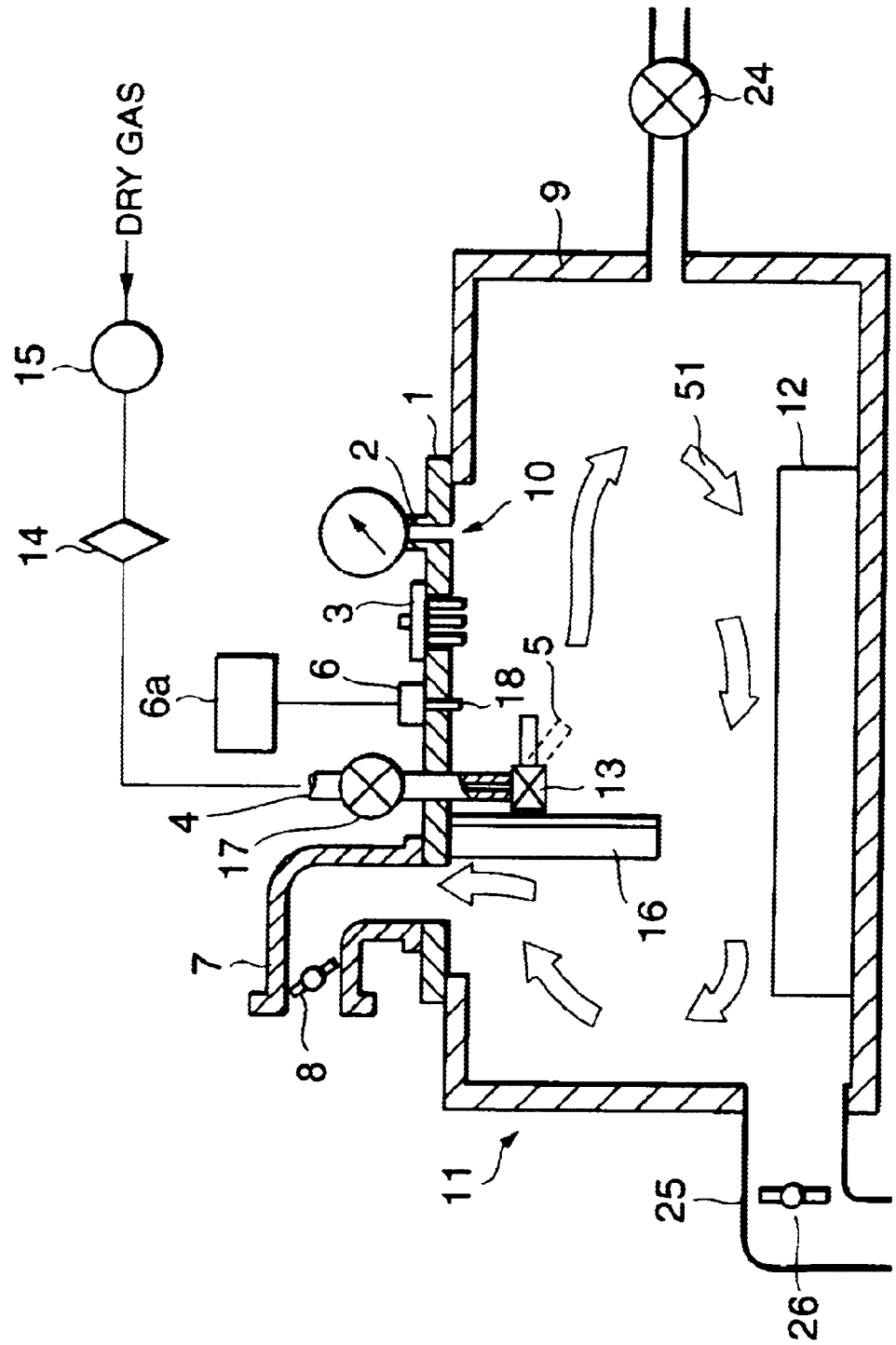
FIG. 4 is a schematic cross section of a cleaning device according to a second embodiment of the present invention.

FIG. 4 shows a second embodiment according to the present invention wherein the lid member 1 shown in FIG. 1 is installed in the chamber for another semiconductor-fabrication apparatus. This chamber of semiconductor-fabrication apparatus is provided with a material gas supply tube 23 and a reactant gas exhaust duct 25 and the shape of wafer stage 12 is different from the one shown in FIG. 1.

In this way, by making the lid member common to the chamber of other kinds of apparatuses, one cleaning device can be commonly used to other same kind of apparatuses and different kinds of apparatuses. Thus both of the cleaning and the cleaning diagnosis are available by commonly applying one cleaning device to a plurality of apparatuses.

Figure 5:
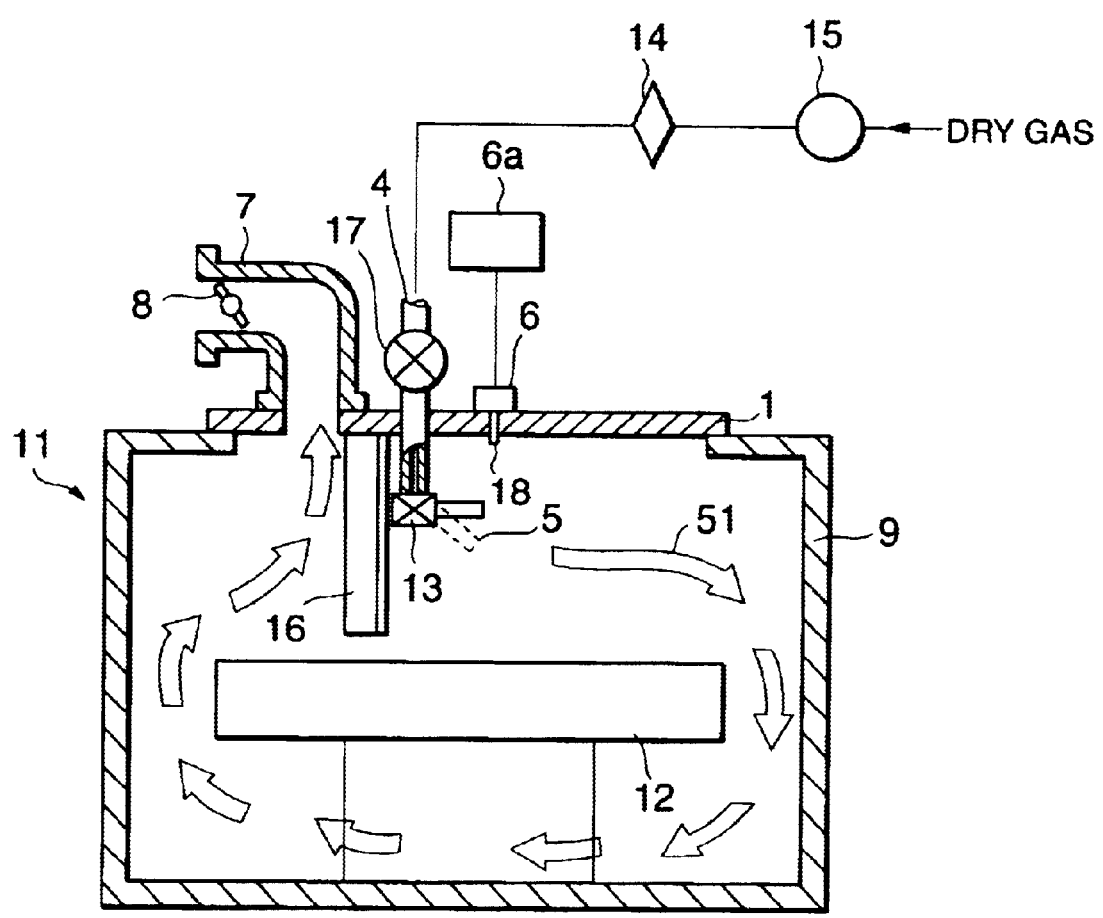
FIG. 5 is a schematic cross section of a cleaning device according to a third embodiment of the present invention.

FIG. 5 shows a third embodiment where the pressure gauge and the pressure regulator valve are eliminated from the device shown in FIG. 1. Even such a device can be used to make either the cleaning or the cleanliness diagnosis if the balance of the displacement of the exhaust duct and the amount of the supply of a dry gas can be adjusted well. In this case, since the space of lid member 1 can be reduced, it is possible to install the lid member in a small chamber, and thus its applicability extends.

Figure 6:
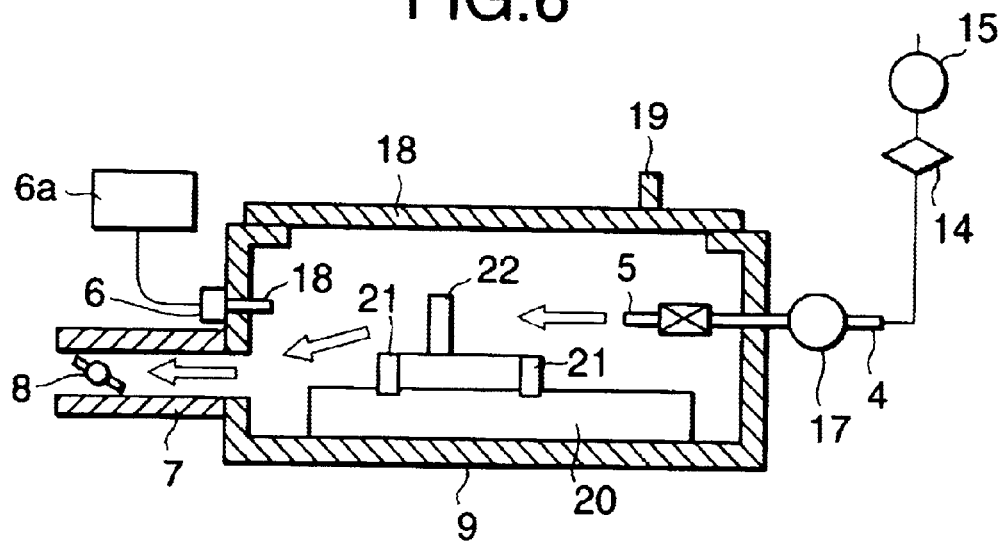
FIG. 6 is a schematic cross section of a cleaning device according to a fourth embodiment of the present invention.

FIG. 6 shows a cleaning device of a fourth embodiment according to the present invention that can be used for either the cleaning or the cleanliness diagnosis for parts of semiconductor-fabrication apparatus. The device has a chamber 9 to store parts to be either cleaned or diagnosed. The chamber 9 is provided with an opening together with a door 18 to close the opening. The parts are put in and out the chamber 9 through the opening.

The sidewall of the chamber is provided with a gas supply tube 4 that has nozzle 5 to jet a dry gas, a valve 17, a filter 14, and regulator 15. On the opposite side wall of the chamber is provided with an exhaust duct 7 such that the parts 22 to be checked for cleanliness are placed between the exhaust duct 7 and the gas supply tube 4. And, the suction port 18 of the particle counter 6 is installed beside the exhaust duct. In chamber 9, there is a supporting stand 20 with a part-fixing member 21, which can be adjusted to fix the parts to be subjected to either the cleaning or the cleanliness diagnosis.

These supporting stand 20 and part-fixing member 21 can be changed to other appropriate type of supporting stands or part-fixing members in accordance with the shape of the parts. In FIG. 6, only a single part is shown but it is possible to accommodate a plurality of parts within the chamber as long as its space is available. Needless to say, above-stated arrangement of the gas supply tube 4, the supporting stand 20 and the door 18 is not limited to the position shown in FIG. 6. The gas supply tube 4 may be provided on a top wall of the chamber and the parts can be put in and out from sidewall side.

Moreover, the cleaning device shown in FIG. 6 can be used as a cleanliness diagnosis device. In that case, using other devices or manual operation with human hands without using the cleaning device of FIG. 6 to shorten its cleaning time can do cleaning process for the parts. After the cleaning process of the parts, its cleaning condition can be diagnosed by using the particle counter while jetting a dry gas into the chamber to examine whether the cleaning was effectively done.

In addition, the dry gas nozzle of the device shown in FIG. 6 can be made movable so as to be scanned as in the device shown in FIG. 1. In that case, its cleaning effect can be improved and the dry gas can be uniformly applied to a plurality of parts. Accordingly, a plurality of parts can be cleaned uniformly. Needless to say, it is preferable to make the dry gas nozzle scan automatically.

According to such device, by cleaning the exchange parts of semiconductor-fabrication apparatus beforehand to achieve a high cleanliness, there is merit that the stop time of semiconductor-fabrication apparatus can be shortened in the condition that only parts are exchanged at the time of cleaning the semiconductor-fabrication apparatus.

Figure 7:
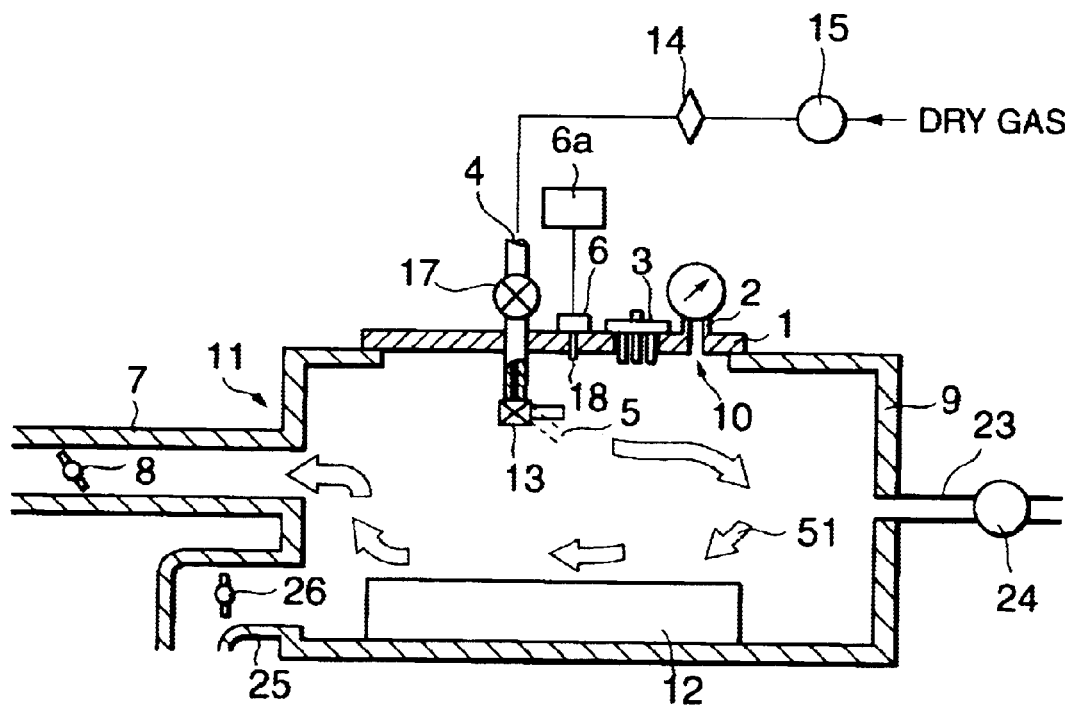
FIG. 7 is a schematic cross section of a cleaning device according to a fifth embodiment of the present invention.

FIG. 7 shows a fifth embodiment according to the present invention by which an exhaust duct installed on lid member 1 is installed on semiconductor-fabrication apparatus. In this embodiment, there is a merit of coming to apply easily to the chamber of a small sheet-fed type. This is because the needed space of lid member 1 becomes small when either one of an exhaust duct 7, a gas supply tube 4, and a particle counter 6 is installed in the chamber of semiconductor-fabrication apparatus like this.

In addition, there is another merit that the mobility of the cleaning device of the present invention rises since necessary piping for the part of lid member 1 used together decreases when the nozzle 5 of a dry gas or the exhaust duct 7 is installed on a semiconductor-fabrication apparatus.

For this case, the reactant gas exhaust duct 25 and the exhaust duct 7 can be made common. However, degree of vacuum demanded by film-forming or etching in semiconductor-fabrication apparatus is greatly different from that demanded in the cleaning or diagnosis device of the present invention wherein near the atmospheric pressure is used. Using the exhaust of the performance more than the necessity for the cleaning and the diagnosis, there is a shortcoming that energy becomes useless.

The second method of cleaning or cleanliness diagnosis is explained by using FIG. 9. FIG. 9 shows a timing chart that explains the second method. FIG. 9A shows the state of a gas suck, and it always basically turns on, and flowing quantity is adjusted if necessary. FIG. 9B shows the timing of the blow or jetting of the gas. The timing is such that it is turned on after the opening of the chamber is closed with lid member 1 of the present invention shown in FIG. 1, and it is turned off after the calculation of the particle by using the particle counter.

FIG. 9C shows the timing of the particle calculation reading. After a predetermined time (It is t1, and t2 in this example), its calculation reading is performed. It goes twice in this example but the numbers of the measurement may be changed in accordance with the needed measurement accuracy.

In the first method, as shown in FIG. 3, wherein both of the cleaning and the cleanliness diagnosis are carried out, the suck of the gas and the jetting of the gas are alternately done. In the method shown in FIG. 9, the gas is jetted while sucking the gas, and the particle calculation reading is done according to predetermined timing (t1 and t2). When the number of particles enters in the standard, either cleaning process or cleanliness diagnosis process ends.

The number of the particle calculation reading is set to the predetermined number if necessary. A big difference between the first method and the second method is whether the suck of the gas and the jetting of the gas are done according to separate timing or it does at the same time. The first method is suitable for the case where the cleaning process is carried out by itself. The second method is suitable for the case where cleaning process is carried out with other method and thereafter diagnosis is carried out to check the cleanliness of the cleaned one.

Moreover, if the second method is used, it is possible to execute it well by adjusting a quantitative balance of the suck and the gush of the gas even in the type without using the pressure gauge and the pressure regulator valve like the device shown in FIG. 5.

FIG. 10 shows a timing chart according to the third method of the present invention. It is basically the same as the second method. Since the FIG. 10A, FIG. 10B and FIG. 10C correspond to the FIG. 9A, FIG. 9B and the FIG. 9C, respectively, those explanations are omitted.

In FIG. 10D, the term of "moving member operation" means that the moving member in the chamber is operated in accordance with on-and-off signals and its operational sequence is equipped with the semiconductor-fabrication apparatus. By moving the moving member in the chamber, the particle that lurks in the moving member will blow up, and thus its portion can be cleaned and particle check is also can be done thereafter.

As described hereinbefore, according to the present invention, after an upper mechanism of a semiconductor processor for etching a wafer and forming films thereon is removed to open a chamber thereof and the opening of the chamber is closed by a light-weight, portable lid member having a dry gas jetting nozzle and a gas discharge duct for removing dry gas in the chamber, a cleaning cycle including a jetting of dry gas into the chamber, inner pressure of which is reduced, to blow up particles staying in the chamber and a discharging of dry gas together with blown up particles staying in the chamber externally through the duct while counting the particles is repeated until the number particles is reduced to substantially zero. Therefore, it is possible to completely remove particles staying in the chamber, so that, when the chamber is opened for a next processing, there is no blowing up of particles. Consequently, a semiconductor substrate is not contaminated by residual particles and it is possible to obtain a high quality semiconductor device.

Furthermore, since it is possible to reduce the weight of the lid member including the exhaust duct and the nozzle to thereby make the unit portable, the cleaning device of the present invention can be applied to various processing apparatuses generally. Therefore, it is possible to reduce the installing cost of the cleaning device.

In other word, the chamber can be cleaned or diagnosed in cleanliness easily and effectively by installing the present device in the chamber for semiconductor-fabrication apparatus only when it is necessary.

Moreover, since parts of maintenance in semiconductor-fabrication apparatus can be cleaned before the time of the exchange, and the maintenance parts of good cleanliness can be prepared, the cleaning time of the part exchange is shortened, and the operation rate can be improved.

In addition, there is an advantage that the cleaning time is shortened, the operation rate of semiconductor-fabrication apparatus is improved, and the production amount of the semiconductor product can be improved by means of using the sequence of the cleaning of the present invention or the cleanliness diagnosis since the present device can effectively do the cleaning and the cleanliness diagnosis.

Moreover, the yield of the semiconductor product can be improved by using semiconductor-fabrication apparatus that passes the cleanliness diagnosis in accordance with the present invention.

What is claimed is:

1. A processing device comprising:
   a chamber having a processing room therein and an opening portion through which said processing room is coupled to an outside of said chamber;
   a lid member provided to close said opening portion of said chamber to isolate said processing room from the outside of said chamber;
   a dry gas jetting nozzle installed in said lid member and jetting, when operated, a dry gas into said processing room of said chamber;
   a discharge duct installed in said lid member and discharging, when operated, said dry gas from said processing room of said chamber; and
   a particle counter installed in said lid member and monitoring, when operated, the number of particles within said chamber.

2. A processing device as claimed in claim 1, further comprising a wafer stage housed in said chamber.

3. A processing device as claimed in claim 2, further comprising a pressure gauge provided in said lid member for measuring inner pressure of said chamber; and a pressure regulator valve provided in said lid member for regulating inner pressure of said chamber; wherein said nozzle is arranged such that said dry gas flows along an outer periphery of said wafer stage within said chamber.

4. A processing device as claimed in claim 3, further comprising a plate member extending downward from said lid member for separating a discharge port of said discharge duet from said nozzle.

5. A processing device as claimed in claim 3, further comprising a damper provided in said discharge duct for regulating an amount of gas discharged through said discharge duct.

6. A processing device as claimed in claim 3, further comprising an angle regulation mechanism for changing an angle of said nozzle.

7. A processing device as claimed in claim 3, wherein said dry gas is nitrogen gas.

8. A cleaning device as claimed in claim 3, wherein said lid member is made of a transparent resin material.

* * * * *